United States Patent
Lin et al.

(10) Patent No.: US 7,436,202 B2
(45) Date of Patent: Oct. 14, 2008

(54) METHOD AND APPARATUS FOR CALIBRATING DRIVER IMPEDANCE

(75) Inventors: Feng Lin, Boise, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 11/523,491

(22) Filed: Sep. 19, 2006

(65) Prior Publication Data

US 2007/0018682 A1    Jan. 25, 2007

Related U.S. Application Data

(63) Continuation of application No. 10/379,006, filed on Mar. 4, 2003, now Pat. No. 7,129,738.

(51) Int. Cl.
*H03K 19/003* (2006.01)

(52) U.S. Cl. .......................................... 326/30; 326/93
(58) Field of Classification Search ................... 326/30
See application file for complete search history.

(56) References Cited

U.S. PATENT DOCUMENTS 6,087,847 A * 7/2000 Mooney et al. ............... 326/30

* cited by examiner

*Primary Examiner*—James H Cho
(74) *Attorney, Agent, or Firm*—Dorsey & Whitney LLP

(57) ABSTRACT

The present invention provides a method and apparatus is provided for calibrating a driver impedance in an integrated circuit device. The method includes providing a signal from a synchronous circuit that is indicative of an impedance mismatch between a driver circuit and a load. The method also includes selecting one of a plurality of impedances of the driver circuit to reduce the impedance mismatch in response to the signal.

23 Claims, 6 Drawing Sheets

METHOD AND APPARATUS FOR CALIBRATING DRIVER IMPEDANCE

CROSS-REFERENCE TO RELATED APPLICATION

This application is a continuation of U. S. application Ser. No. 10/379,006, filed Mar. 4,2003, issued as U.S. Pat. No. 7,129,738.

BACKGROUND OF THE INVENTION

1. Field of the Invention

This invention relates generally to an integrated circuit device, and, more particularly, to calibrating a driver impedance in the integrated circuit device.

2. Description of the Related Art

Integrated circuit devices are typically formed on semiconductor dice and then enclosed in a package, which may be mounted on a printed circuit board. To couple the integrated circuit device to other devices, the package may include one or more conductive pads or pins that are coupled to the integrated circuit device. When the package is mounted on the printed circuit board, the pins may come into electrical contact with conductive traces and/or wires on the printed circuit board, thereby permitting the integrated circuit device to communicate with other circuits or devices via the conductive traces and/or wires. For example, a processor may send instructions to a bus by transmitting a signal to a pin in the processor package. The signal may then be transmitted along a trace, to a pin in the package containing the bus circuitry, and to the bus circuitry.

In a typical embodiment, a package 100 may include a driver circuit 105 coupled to a pad 110 and internal circuitry 120, as shown in FIG. 1. The driver circuit 105 may be used to maintain the integrity of signals transmitted and/or received by the internal circuitry 120. In particular, matching the impedance of the driver circuit 105 to the impedance of a load 130, such as an external resistor, coupled to the pad 110 is important for preserving the integrity of signals transmitted and received by the internal circuitry 120. Thus, it is common in the art to calibrate an impedance of the driver circuit 105. For example, a plurality of drivers 140 in the driver circuit 105 may be coupled in parallel between the internal circuitry 120 and the pad 110. By selecting and activating one or more of the plurality of drivers 140, the impedance of the driver circuit 105 may be matched to a predicted impedance of the load 130. For example, if the drivers 140 each have an impedance of 240 $\Omega$, then the driver circuit 105 shown in FIG. 1 may have an impedance of 240 $\Omega$, 120 $\Omega$, 80 $\Omega$, or 60 $\Omega$ The driver circuit 105 consumes power when it is being calibrated, so the driver circuit 105 shown in FIG. 1 is calibrated periodically to conserve power. For example, a clock 150 may be coupled to the driver circuit 105, and the clock 150 may provide a periodic clock signal to the driver circuit 105. The driver circuit 105 may use the periodic clock signal to trigger a calibration every clock cycle. This approach has several drawbacks. First, it may not be necessary to calibrate the driver circuit 105 on every clock cycle. For example, the impedance of the driver circuit 105 and/or the impedance of the load 130 may change slowly relative to the period of the clock cycle. The unnecessary calibrations may waste power and unnecessarily heat the device.

Second, it may be necessary to calibrate the driver circuit 105 more often than once every clock cycle. For example, the impedance of the driver circuit 105 and/or the impedance of the load 130 may change rapidly relative to the period of the clock cycle. Calibrating the driver circuit 105 using the periodic clock signal may result in an impedance mismatch between the driver circuit 105 and the load 130 to form and/or persist. The impedance mismatch may degrade the integrity of signals transmitted through the pad 110 and the driver circuit 105. This may potentially degrade the performance of the internal circuitry 120 and the performance of circuits (not shown) in the load 130.

SUMMARY OF THE INVENTION

In one aspect of the present invention, a method is provided for calibrating a driver impedance in an integrated circuit device. The method includes providing a signal from a synchronous circuit that is indicative of an impedance mismatch between a driver circuit and a load. The method also includes selecting one of a plurality of impedances of the driver circuit to reduce the impedance mismatch in response to the signal.

In another aspect of the instant invention, an apparatus is provided for calibrating a driver impedance in an integrated circuit device. The apparatus includes a driver circuit having a first plurality of impedances, a synchronous circuit capable of providing a signal indicative of an impedance mismatch between the driver circuit and a load, and a controller for selecting one of the first plurality of impedances to reduce the impedance mismatch in response to the signal.

BRIEF DESCRIPTION OF THE DRAWINGS

The invention may be understood by reference to the following description taken in conjunction with the accompanying drawings, in which like reference numerals identify like elements, and in which.

Figure 1:
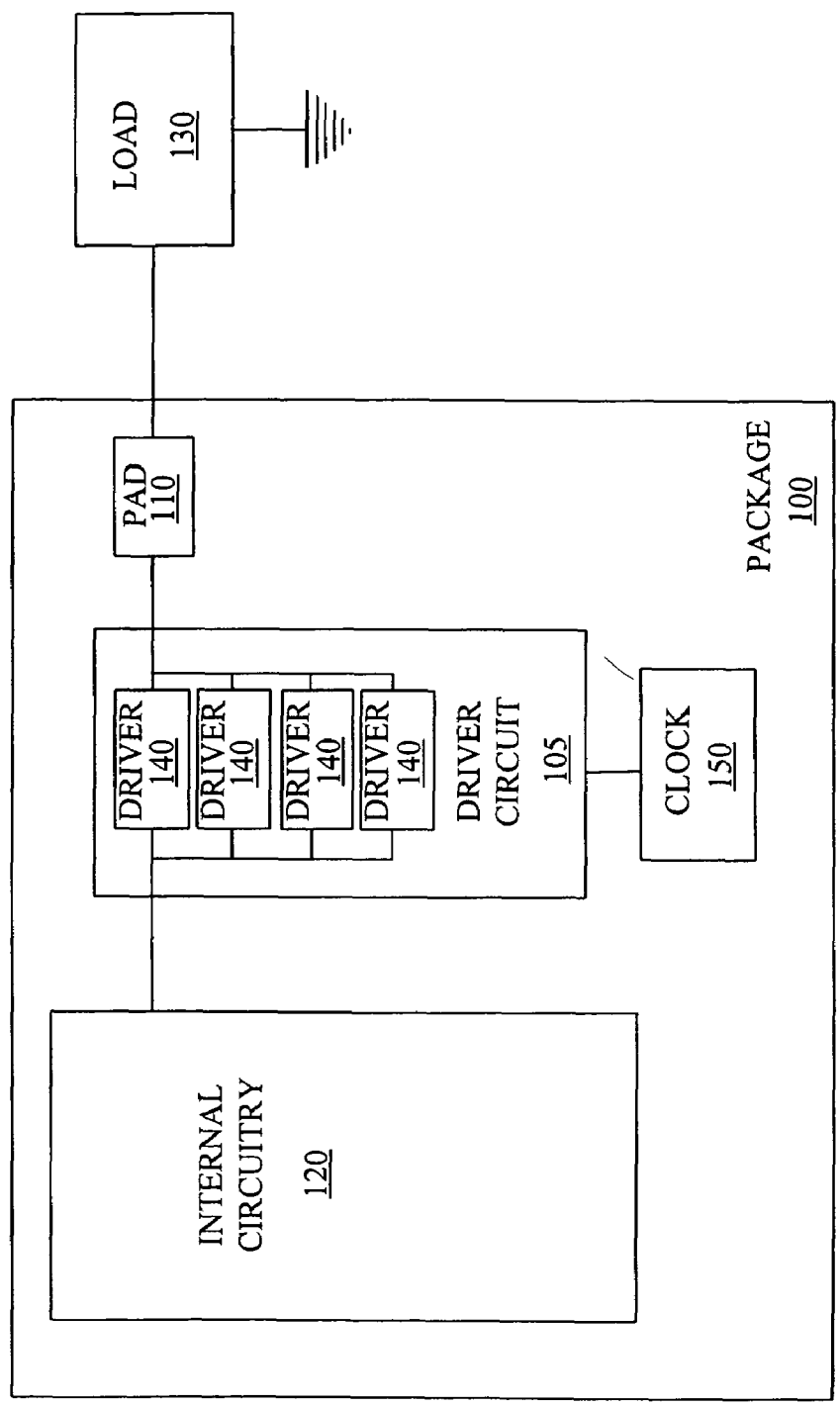
FIG. 1 shows a prior art driver circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
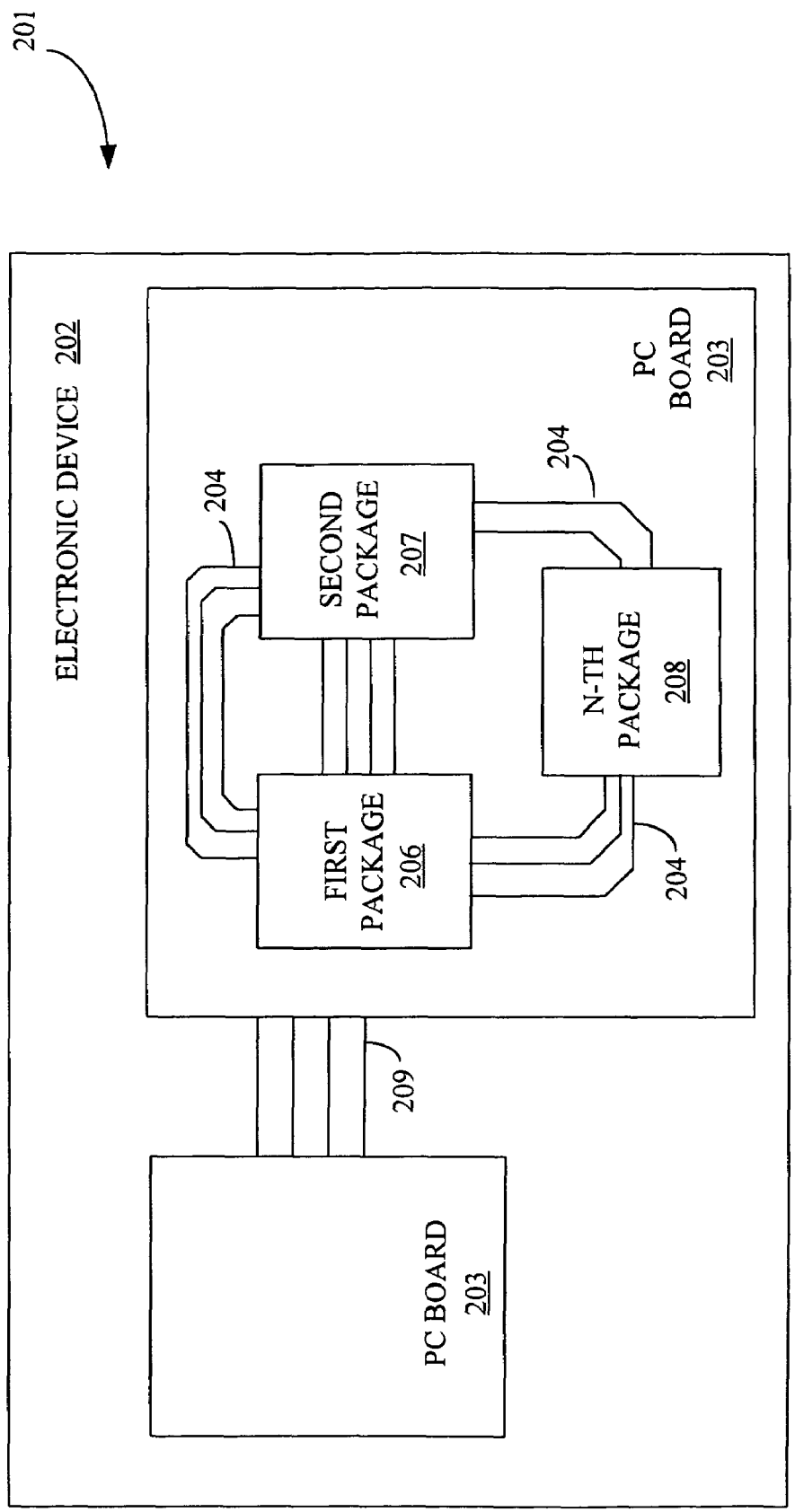
FIG. 2A shows a block diagram of an electronic device including a plurality of packages, in accordance with one embodiment of the present invention.

Turning now to FIG. 2A, a system in accordance with one embodiment of the present invention is illustrated. The system 201 comprises an electronic device 202. In various alternative embodiments, the electronic device 202 may be a computer system, such as a mainframe computer, a personal desktop computer, a laptop computer, and the like. The electronic device 202 may comprise one or more PC boards 203, which may comprise a variety of electrical and electronic packages. For example, the PC board 203 may comprise a first package 206, a second package 207, through an N-th package 208. However, it will be appreciated that the system 201 may, in alternative embodiments, include more or fewer electronic devices 202, which may include more or fewer packages 206, 207, 208.

The first package through N-th packages 206, 207, 208 may be a variety of electronic components such as memory devices, processors, buffers, registers, and the like. The various packages 206, 207, 208 on the PC board 203 may be interconnected via conductive lines 204 embedded into the PC board 203. The conductive lines 204 carry electrical signals between the packages 206, 207, 208. Generally, the conductive lines 204 may be comprised of etched copper traces that connect to connection pads on which the packages 206, 207, 208 are electrically coupled. In one embodiment, the packages 206, 207, 208 may comprise the impedance calibration system provided by embodiments of the present invention, which are described in detail below.

In one embodiment, the PC boards 203 are connected to each other to enable the electronic device 202 to perform a predetermined function. For example, the PC board 203 may be a motherboard in a computer system where in the second PC board 203 may be a peripheral PC board, such as an Ethernet connection PC board, and the first and second PC boards 203 may be interconnected via wires, traces, or other connectors 209. Utilizing embodiments of the present invention, which are described in detail below, the impedance of components of the various packages 206, 207, 208 on the PC board 203 may be calibrated to more effectively communicate and transmit electrical signals thereby enhance the performance of the electronic device 202.

Figure 2B:
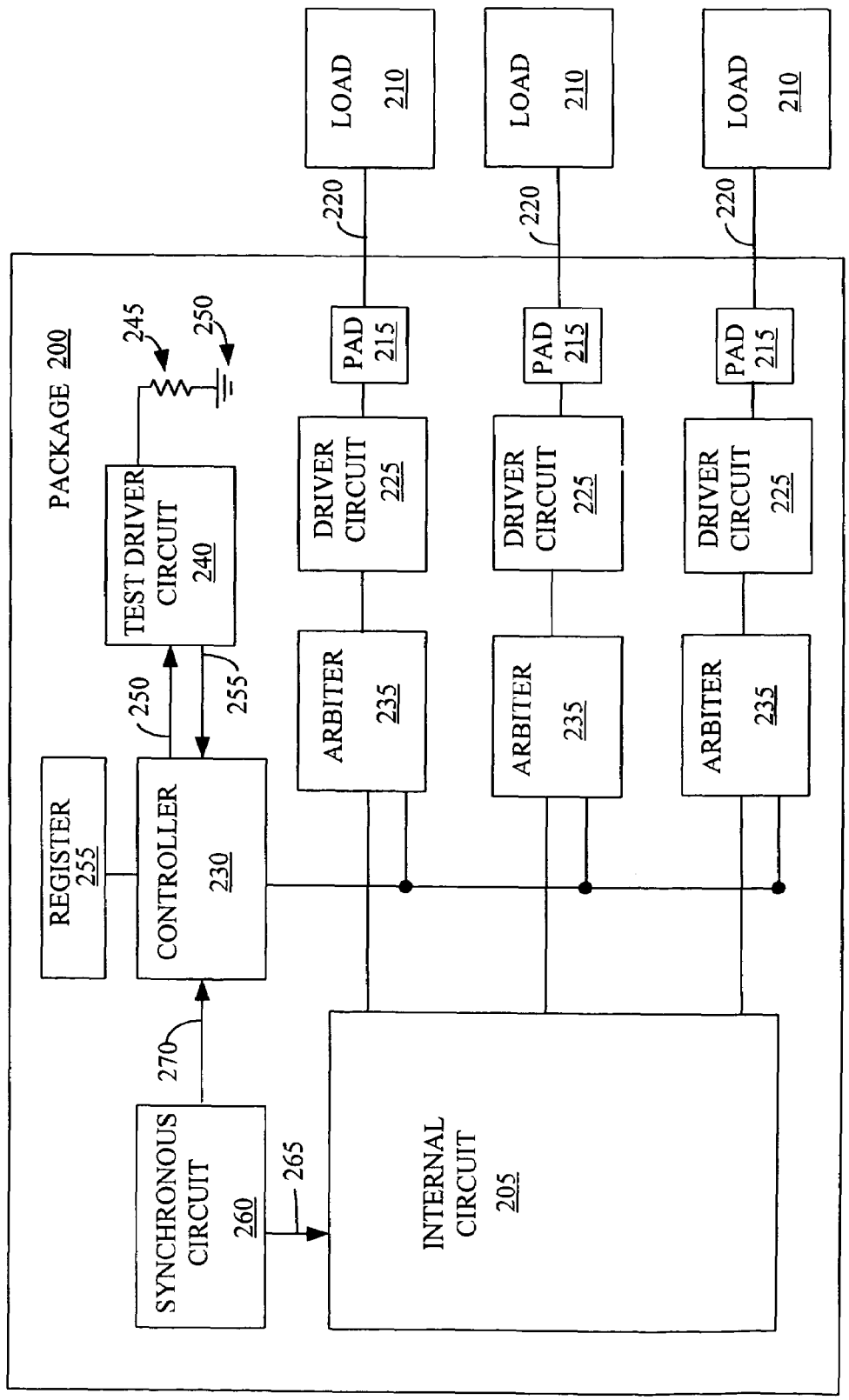
FIG. 2B shows a block diagram of a package including an internal circuit and a plurality of driver circuits, in accordance with one embodiment of the present invention.

Referring now to FIG. 2B, a package 200 including an internal circuit 205 is shown. The internal circuit 205 is formed on a semiconductor substrate (not shown) and then enclosed in the package 200. In various embodiments, the internal circuit 205 may be capable of performing a variety of operations. For example, the internal circuit 205 may be a processor, a memory device, a bus, any combination of these devices, or another similar device. However, the specific operations that may be performed by the internal circuit 205 are not material to the present invention. Thus, in the interest of clarity, only the details of the operation of the internal circuit 205 that are relevant to the present invention will be discussed herein.

The internal circuit 105 may exchange signals with one or more loads 210. For example, the package 200 may, in one embodiment, be mounted on a printed circuit board (not shown). The loads 210 may also be mounted to the printed circuit board. Although the precise nature of the loads is not material to the present invention, in various alternative embodiments, the loads 210 may be other packages, circuits, devices, and the like. To allow the internal circuit 205 to exchange signals with the loads 210, the package may include one or more pads 215. The term "pad," as used hereinafter, will be understood to include input or output pads, pins, or any other similar connecting device.

The pads 215 may be coupled to the loads 210 and thereby provide a path 220 for signals to pass from the pads 215 to the loads 210, and for signals to pass from the loads 210 to the pads 215. For example, the pad 215 may be physically coupled to an electrically conductive trace 204 that is physically coupled to the load 210 to provide an electrically conductive path 220 between the pads 215 and the loads 210. However, it will be noted that the present invention is not limited to packages 200 that are mounted on printed circuit boards. For example, the package 200 and/or the loads 210 may be a stand-alone device that may be coupled in any desirable manner including wires, traces, and the like.

One or more driver circuits 225 may be coupled to the pads 215. In one embodiment, the driver circuits 225 may be used to maintain or improve the integrity of the signals that are transmitted and/or received by the internal circuit 205. In an alternative embodiment, the drivers 225 may be used to substantially match the impedance that the pads 215 "see" towards the direction of the path 220 connecting the pads 215 to the loads 210. The driver circuits 225 may also be used to match the impedance of the loads 210 to the impedance of circuits in the package 200, such as the internal circuit 205. However, the impedances of the driver circuits 225 may not remain constant over time. For one example, voltages supplied to the circuits in the package 200 and/or the loads 210 may vary over time, causing the impedances of the driver circuits 225 and/or the loads 210 to change. As another example, temperatures of the package 200 and/or the loads 210 may vary over time, causing the impedances of the driver circuits 225 and/or the loads 210 to change. As yet another example, variable processes, e.g. die-to-die processes, may cause the impedances of the driver circuits 225 and/or the loads 210 to change.

The impedances of the circuits in the package 200 and the loads 210 may not change by the same amount in response to variations in the voltages and/or the temperatures and/or the processes, which may cause an impedance mismatch to form between the driver circuits 225 and the loads 210. Thus, in accordance with one embodiment of the present invention, the driver circuits 225 may be variable impedance driver circuits 225.

Figure 3B:
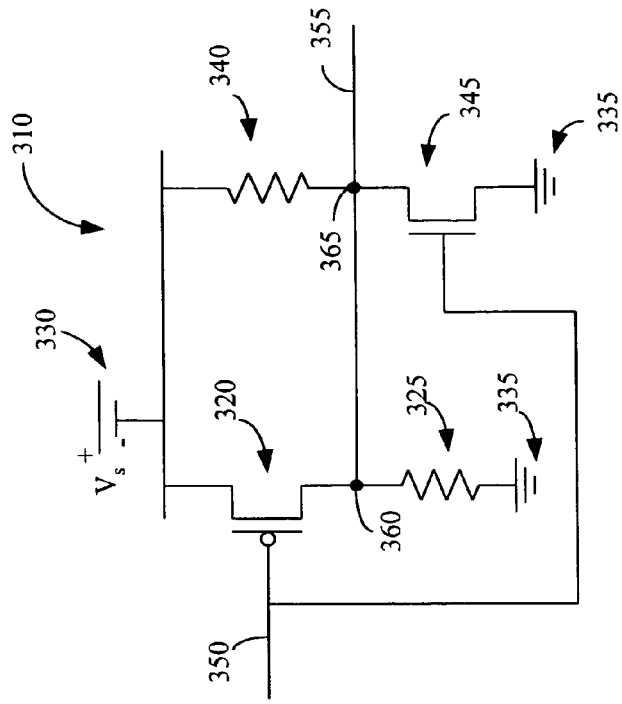
FIGS. 3A-C show aspects of a driver circuit that may be used in the package shown in FIG. 2, in accordance with one embodiment of the present invention.
Figure 3A:
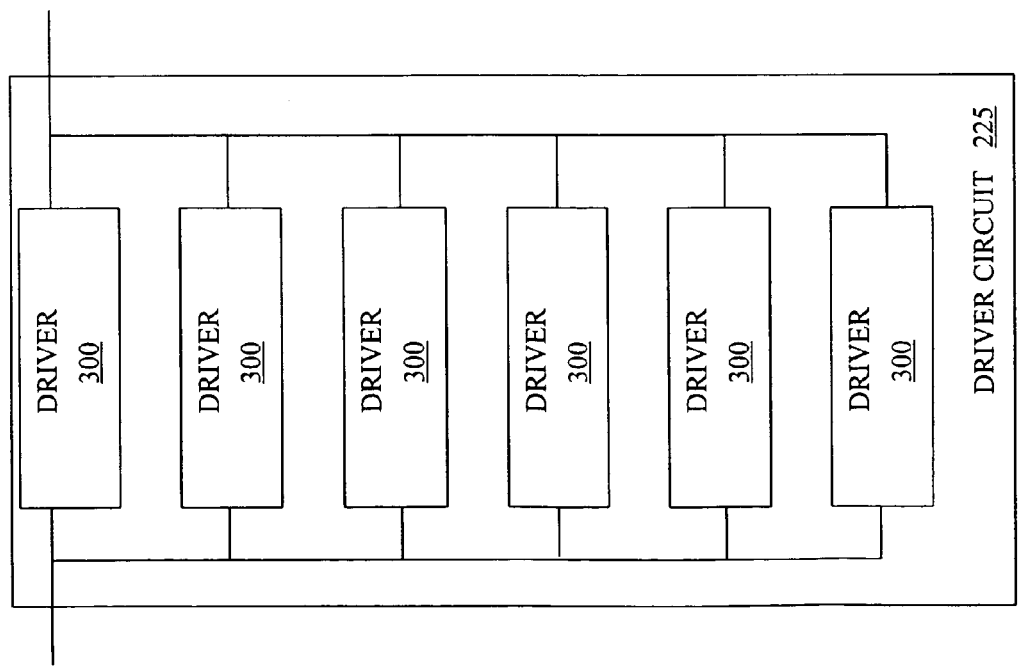

Referring now to FIG. 3A, one embodiment of a variable impedance driver circuit 225 is shown. In one embodiment, the driver circuit 225 may include one or more drivers 300. For example, the drivers 300 may include pull-up/pull-down drivers 310, such as the exemplary pull-up/pull-down driver 310 shown in FIG. 3B. The pull-up/pull-down driver 310 includes a PMOS transistor 320 and a first resistor 325 coupled in series between a source voltage 330 and a ground potential 335. The pull-up/pull-down driver 310 also includes an NMOS transistor 340 and a second resistor 345 coupled in series between the source voltage 330 and the ground potential 335. However, it will be appreciated that the present invention is not so limited. Any desirable number of transistors, resistors or other components may be included in the driver 310 without departing from the scope of the present invention. In addition, the drivers 300 may be any desirable type of driver, including pull-up drivers, pull-down drivers, and the like.

In the exemplary pull-up/pull-down driver 310, an input line 350 is coupled to a gate of the PMOS transistor 320 and a gate of the NMOS transistor 340. An output line 355 is coupled to a first node 360 between the PMOS transistor 320 and the first resistor 325, as well as a second node 365 between the NMOS transistor 340 and the second resistor 345. Consequently, the exemplary pull-up/pull-down driver 310 shown in FIG. 3B is an inverter circuit such that a logic-high signal on the input line 350 will produce a logic-low signal on the output line 355, and a logic-low signal on the input line 350 will produce a logic-high signal on the output line 355. However, the present invention is not so limited. For example, in an alternative embodiment, the drivers 300 may be non-inverting drivers.

The impedance of the drivers 300 is determined, at least in part, by the components of the drivers 300. For example, in one embodiment, the impedance of the exemplary pull-up/pull-down driver 310 is determined, at least in part, by the impedances of the transistors 320, 340 and the resistors 325, 345. Accordingly, the impedance of the driver circuit 225 is determined, at least in part, by the impedances of the drivers 300. For example, if six drivers 300 having an impedance of approximately 240 Ω are coupled in parallel, the impedance of the driver circuit 225 would be approximately 40 Ω. It will be noted that impedances are generally known to within selected tolerances, and that these tolerances are a matter of design choice and not material to the present invention. Thus, the term "approximately" is intended to include at least the variations in the nominal impedances allowed by the tolerances that may be chosen for a particular embodiment.

Moreover, the impedance of the driver circuit 255 may be varied by changing the number of drivers 300 that are coupled in parallel. For example, in one embodiment, the drivers 300 each have an impedance of approximately 240 Ω and may be selectively coupled together in the driver circuit 225. Thus, if the driver circuit 255 includes six drivers 300, then the driver circuit 255 may have an impedance of approximately 240 Ω, 120 Ω, 80 Ω, 60 Ω, 48 Ω, or 40 Ω, depending on the number of drivers 300 that are coupled in parallel. However, it will be appreciated that the number and/or impedance of the drivers is a matter of design choice and not material to the present invention. Thus, any desirable number of drivers having any desirable impedance may be selected. Furthermore, the process by which the impedance of the driver circuit 255 is varied is not material to the present invention. For example, the driver circuit 255 may include one or more transistors (not shown) and the impedance of the driver circuit 255 may be varied by turning the one or more transistors on or off. For another example, the bias voltage f the one or more transistors may be varied to change the impedance of the driver circuit 255.

Referring back to FIG. 2, the impedance of the driver circuit 225 and the loads 210 may also be affected by other factors. For example, as discussed above, temperature, voltage, and/or process variations may cause the impedances of the driver circuit 225 and/or the loads 210 to vary, potentially causing an impedance mismatch that may degrade the integrity of signals transmitted and/or received by the internal circuit 205. Thus, a controller 230 is included in the package 200. In one embodiment, the controller 230 is coupled to one or more arbiters 235, which are coupled to the internal circuit 205 and the driver circuits 225. Although the controller 230 and the arbiters 235 have been depicted as separate entities, it will be appreciated that, in alternative embodiments, the controller 230 and the arbiters 235 may be embodied in more or fewer devices.

In one embodiment, the controller 230 is coupled to a test driver circuit 240, which may be coupled to a load such as a resistor 245, which may be coupled to an electrical ground potential 250. The controller 230 may use the test driver circuit 240 to determine when an impedance mismatch may exist between the driver circuits 225 and the loads 210. For example, the controller 230 may provide a test signal 250, such as an electrical current or voltage, to the test driver circuit 240 and the resistor 245. The test driver circuit 240 may then provide a response signal 255, such as an electrical current or voltage, in response to the test signal 250. The controller 230 may then use the test signal 250 and the response signal 250 in a manner known to those of ordinary skill in the art having benefit of the present disclosure to determine if an impedance mismatch may exist. Although the test driver circuit 240 is depicted as a separate entity in FIG. 2, the present invention is not so limited. In alternative embodiments, the test driver circuit 240 may be one or more of the driver circuits 225.

The controller 230 may also determine a desirable impedance of the driver circuit 225 such that the impedance mismatch may be reduced or even substantially eliminated. For example, the controller 230 may determine that the impedance mismatch may be reduced by changing the impedance of the driver circuit 225 from 240 Ω to 120 Ω. Thus, the controller 230 may provide an instruction that may be used by one or more of the driver circuits 225 to change their respective impedances. For example, the controller 230 may instruct one or more of the driver circuits 225 to couple an additional driver 300 in parallel and thereby reduce the impedance of the driver circuits 225 from 240 Ω to 120 Ω. In one embodiment, the instruction may be a digital signal including one or more bits that indicate which drivers 300 are to be coupled in parallel. For example, the instruction may be "110000," which indicates that two of the six drivers 300 are to be coupled in parallel.

However, it may not always be desirable to provide instructions to the driver circuits 225. For example, the driver circuits 225 may be performing a process, such as reading or writing data. For another example, the driver circuits 225 may be in a pre-active state prior to performing a process, such as reading or writing data. Thus, the arbiters 235 may determine an appropriate time to transmit the signal from the controller 230 to the driver circuits 225. For example, the arbiters 235 may allow the controller 230 to provide instructions to one or more of the driver circuits 225 when one or more of the driver circuits 225 are inactive or not in the pre-active state. Conversely, the arbiters 235 may not allow the controller 230 to provide instructions to one or more of the driver circuits 225 when one or more of the driver circuits 225 are active or in a pre-active state.

Figure 3C:
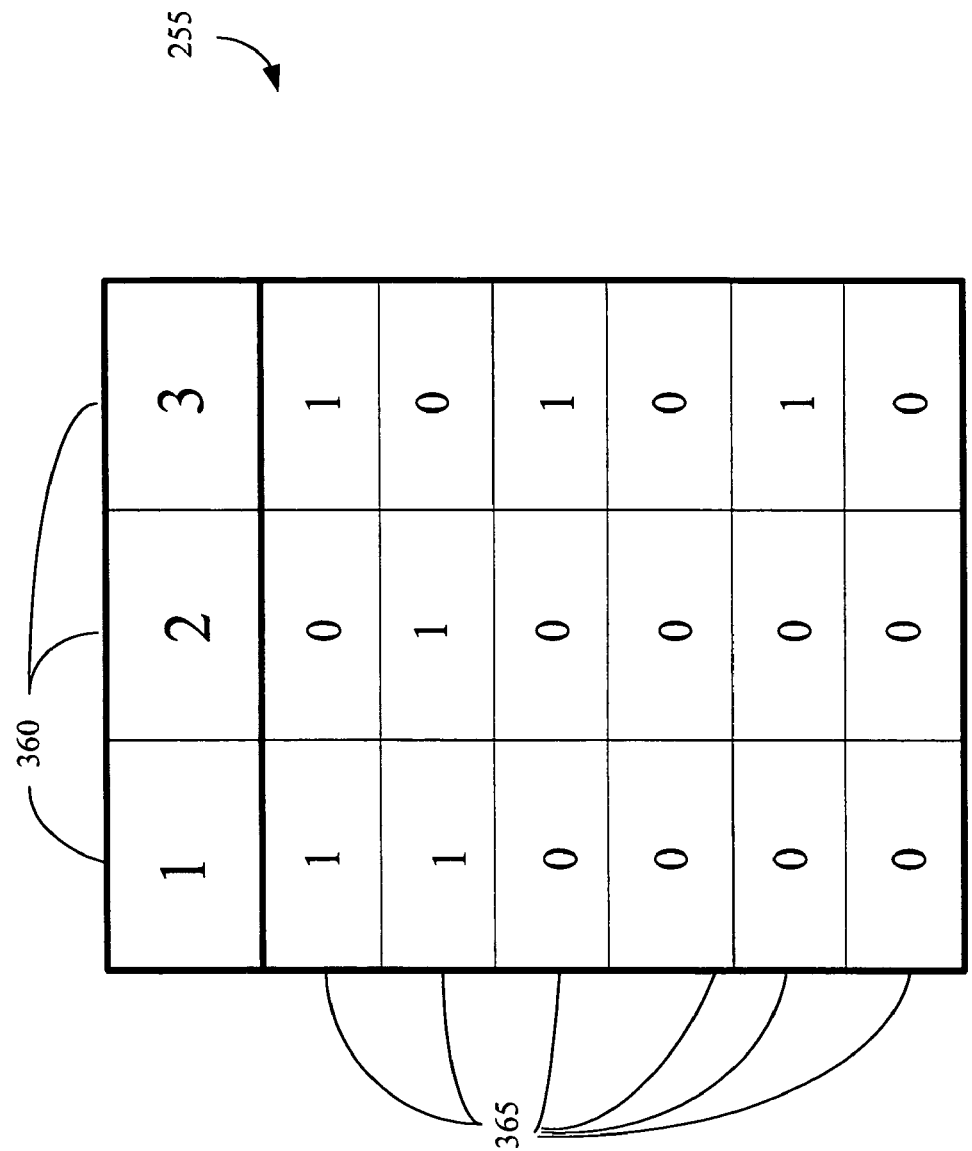

A register 255 may, in one embodiment, be coupled to the controller 230. The register 255 may be used to store one or more instructions. For example, the register 255 may include a plurality of columns 360 and rows 365, as shown in FIG. 3C. Each column 360 and row 365 pair may correspond to one of the drivers 300 in one of the driver circuits 225. The instructions may then be stored as bits in the register 255. For example, in the column 360 indicated by the numeral "1," the bits that are set to a value of "1" indicate that the corresponding driver 300 is to be coupled in parallel. The bits that are set to a value of "0" indicate that the corresponding driver 300 is not to be coupled in parallel. As illustrated in FIG. 3C, it is not necessary for the bits to be set in any particular order, and thus for the drivers 300 to be coupled in parallel in any particular order, nor is it necessary for all the driver circuits 225 to have the same impedance.

In one embodiment, the controller 230 may store instructions in the register 255 when one or more of the driver circuits 225 are active and the arbiter 235 does not allow the controller 230 to instruct one or more of the driver circuits 225. For example, the arbiter 235 may indicate to the controller 230 that the driver circuits 225 are active or in a pre-active state. In that case, the controller 255 may store the instructions in the register 255. The controller 255 may also retrieve one or more of the instructions from the register 255. For example, the controller 255 may retrieve the instructions from the register 255 in response to an indication from the arbiters 235 that the driver circuits 225 are inactive or not in a pre-active state.

Current typically passes from the test driver circuit 240 through the resistor 245 to the ground potential 250 when the test driver circuit 240 is in operation. To reduce current losses, conserve power, and/or reduce heating of the package 200, the test driver circuit 240 may be operated at selected times. The temperature, voltage, and/or process variations that can create an impedance mismatch may not, however, occur at predictable intervals. For example, a laptop computer including the package 200 may be used primarily in a climate-controlled room and may rarely experience temperature variations. The same laptop computer carried regularly from indoor to outdoor environments may experience temperature variations of several degrees in less than a minute. Thus, in accordance with one embodiment of the present invention, the controller 230 may receive an update signal 270 indicative of the impedance mismatch from a synchronous circuit 270 and may calibrate the driver circuits 225 in response to receiving the update signal 270.

The package 200 typically includes the synchronous circuit 260 to synchronize one or more internal clock signals to an external clock signal. The internal clock signals may, in various alternative embodiments, be clock signals used by the internal circuitry 205, the arbiters 235, the driver circuits 225, and any other desirable circuitry in the package 200. For example, the synchronous circuit 260 may provide a synchronized clock signal 265 to the internal circuit 205. Examples of the synchronous circuit 260 include, but are not limited to, delay-locked loops, phase-locked loops, and synchronous mirror delays. The synchronous circuit 260 monitors a phase difference between the one or more internal clock signals and the external clock signal and provides one or more adjustment signals in response to detecting the phase difference. In one embodiment, the synchronous circuit 260 may provide a fine adjustment signal in response to detecting small phase differences and a coarse adjustment signal in response to detecting large phase differences.

The phase differences detected by the synchronous circuit 260 may indicate that it is desirable to calibrate the driver circuits 225. For example, changes in the temperature and/or voltages in the package 200 may create a phase difference between an internal clock and the external clock. The same changes may also create the aforementioned impedance mismatch. Thus, in accordance with one embodiment of the present invention, one or more of the adjustment signals may be used to provide the update signal 270 indicative of the impedance mismatch to the controller 230. For example, the coarse adjustment signal from the synchronous circuit 260 may be used to provide the update signal 270. For another example, two consecutive coarse adjustment signals in the same direction (i.e. two consecutive positive or negative changes in the phase difference) may be used to provide the update signal 270.

Figure 4:
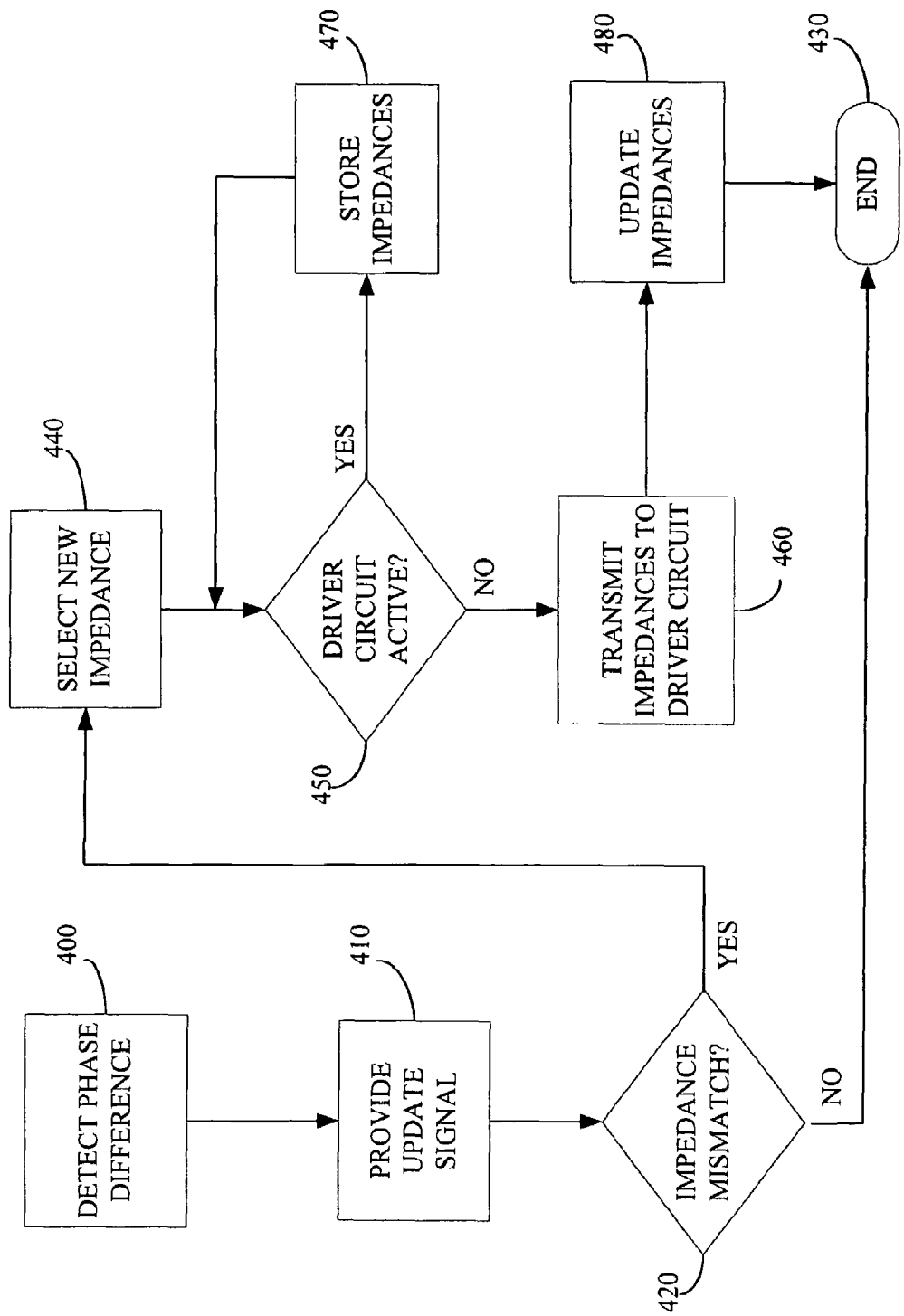
FIG. 4 shows a flow chart illustrating a method of calibrating a driver circuits such as the driver circuits shown in FIG. 2, in accordance with one embodiment of the present invention.

Referring now to FIG. 4, a flow chart illustrating one embodiment of a process of calibrating the driver circuits 225 is shown. In the illustrated process, a phase difference that may be indicative of an impedance mismatch is detected (at 400) by a synchronous circuit 260, which provides (at 410) the update signal 270 to the controller 230 in response to detecting (at 400) the phase difference. In response to the update signal 270, the controller 230 determines (at 420) whether an impedance mismatch may be present. If the controller 230 determines (at 420) that no mismatch is present, or that the impedance mismatch is small enough that it is not desirable to change the impedance of the driver circuit 225, the process ends (at 430). If the controller 230 determines (at 420) that the impedance mismatch is greater than a predetermined range of tolerance values, a determination may be made that it is desirable to change the impedance of the driver circuit 225 to reduce the impedance mismatch. The controller 230 then selects (at 440) one or more new impedances for the driver circuits 225.

The arbiter 235 may determine (at 450) whether the driver circuits 225 are active or in a pre-active state. If the driver circuits 225 are active or in a pre-active state, the controller 230 may store (at 460) the new impedances, or a representation of the new impedances, in the register 255 until the arbiters 225 determine (at 460) that the driver circuits 225 are inactive or not in a pre-active state. If the driver circuits 225 are inactive or not in a pre-active state, the controller 230 may transmit (at 470) the new impedances, or a representation of the new impedances, to the driver circuits 225, which may update (at 480) the impedances. The process may then end (at 430).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   receiving an external clock signal;
   generating an internal clock signal;
   detecting a phase difference between the external clock signal and the internal clock signal;
   generating an adjustment signal to reduce the phase difference between the external clock signal and the internal clock signal; and
   responsive to the adjustment signal, calibrating an impedance of a driver circuit to reduce a difference between the impedance of the driver circuit and a load.

2. The method of claim 1, further comprising:
   periodically detecting the phase difference and generating the adjustment signal; and wherein the act of calibrating the impedance of the driver circuit occurs responsive to an analysis of the adjustment signal over time.

3. The method of claim 2 wherein the adjustment signal includes a coarse adjustment signal and a fine adjustment signal and the act of calibrating the impedance of the driver circuit occurs responsive to an analysis of the coarse adjustment signal over time.

4. The method of claim 3 wherein the coarse adjustment signal has a sign, the act of calibrating the impedance of the driver circuit occurring responsive to a plurality of successive coarse adjustment signals having a same sign.

5. The method of claim 2 wherein the act of calibrating the impedance of the driver circuit occurs when the adjustment signal indicates a change in temperature has occurred.

6. The method of claim 1 further comprising:
   measuring the difference between the impedance of the driver circuit and the load, responsive to the adjustment signal; and wherein the act of calibrating the driver impedance occurs when the difference exceeds a threshold.

7. The method of claim 1 wherein the driver circuit has a plurality of impedances and the act of calibrating the impedance of the driver circuit includes selecting one of the plurality of impedances to reduce the difference between the impedance of the driver circuit and the load.

8. The method of claim 7 further comprising:
storing the selected impedance in a register; and
updating the impedance of the driver circuit responsive to a signal indicating the driver circuit is inactive.

9. An apparatus comprising:
a driver circuit having an impedance and configured to output a signal;
a synchronous circuit configured to receive an external clock signal and an internal clock signal and detect a phase difference between the external clock signal and the internal clock signal, the synchronous circuit further configured to generate an adjustment signal responsive to the phase difference between the external clock signal and the internal clock signal and to generate an update signal responsive to the adjustment signal; and
a controller coupled to receive the update signal and, responsive to the update signal, to measure a difference between the impedance of the driver circuit and a target impedance, the controller further configured to calibrate the impedance of the driver circuit responsive to reduce the difference.

10. The apparatus of claim 9 wherein the synchronous circuit includes a delay-locked loop.

11. The apparatus of claim 9 wherein the synchronous circuit includes a phase-locked loop.

12. The apparatus of claim 9 wherein the synchronous circuit includes a synchronous mirror delay circuit.

13. The apparatus of claim 9 further comprising a test driver circuit coupled to the controller, the controller configured to couple a test signal to the test driver circuit and the test driver circuit configured to couple a response signal to the controller, the response signal indicative of the difference between the impedance of the driver circuit and the target impedance.

14. The apparatus of claim 9 further comprising:
an arbiter coupled to the controller and the driver circuit, the arbiter configured to couple an indication to the controller representative of whether the driver circuit is in an active or an inactive state, the controller further configured to calibrate the impedance of the driver circuit responsive to the indication the driver circuit is in the inactive state.

15. The apparatus of claim 9 further comprising:
a register coupled to the controller, the controller configured to store a calibration instruction in the register responsive to the indication from the arbiter that the driver circuit is in the active state, the controller further configured to retrieve the instruction from the register responsive to the indication from the arbiter that the driver circuit is in the inactive state.

16. The apparatus of claim 9 wherein the driver circuit includes a plurality of drivers, each having a driver impedance and the controller is configured to calibrate the impedance of the driver circuit by coupling an additional driver having the driver impedance to the driver circuit.

17. The apparatus of claim 1 wherein the driver circuit includes a transistor and the controller is configured to calibrate the impedance of the driver circuit by turning the transistor on or off.

18. The apparatus of claim 1 wherein the driver circuit includes a transistor and the controller is configured to calibrate the impedance of the driver circuit by varying a bias voltage of the transistor.

19. An electronic device comprising:
a printed circuit board;
a package mounted on the printed circuit board;
a load mounted on the printed circuit board;
an internal circuit on the package;
a synchronous circuit on the package and configured to receive an external clock signal from outside the package and an internal clock signal generated on the package, the synchronous circuit configured to detect a phase difference between the external clock signal and the internal clock signal and provide a corrected internal clock signal to the internal circuit;
a driver circuit on the package coupled to receive a signal from the internal circuit and couple the internal circuit to the load;
a controller on the package coupled to the synchronous circuit and the driver circuit, the controller operable to calibrate an impedance of the driver circuit to reduce a difference between the impedance of the driver circuit and the load responsive to the phase difference between the external clock signal and the internal clock signal.

20. An electronic device according to claim 19 further comprising:
a test driver circuit on the package coupled to receive a test signal from the controller and to couple a response signal to the controller indicative of the difference between the impedance of the driver circuit and the load.

21. An electronic device according to claim 19 further comprising:
a plurality of driver circuits on the package, and a plurality of loads on the printed circuit board, each of the plurality of driver circuits coupled to a respective one of the plurality of loads, the controller further operable to calibrate an impedance of each of the plurality of driver circuits responsive to the phase difference between the external clock signal and the internal clock signal.

22. An electronic device according to claim 21 further comprising:
a plurality of arbiters, each coupled to a respective one of the plurality of driver circuits, each of the plurality of arbiters configured to determine if the respective one of the plurality of driver circuits is in an active state; and
a register coupled to the controller, the controller configured to store a calibration instruction for a target one of the plurality of driver circuits in the register when the target one of the plurality of driver circuits is in the active state.

23. An electronic device according to claim 22 wherein the register includes storage for a plurality of bits and each of the plurality of driver circuits includes a respective plurality of driver components, each of the plurality of bits corresponding to one of the plurality of driver components.

* * * * *

UNITED STATES PATENT AND TRADEMARK OFFICE
CERTIFICATE OF CORRECTION

PATENT NO. : 7,436,202 B2 Page 1 of 1
APPLICATION NO. : 11/523491
DATED : October 14, 2008
INVENTOR(S) : Lin et al.

It is certified that error appears in the above-identified patent and that said Letters Patent is hereby corrected as shown below:

In column 10, line 1, in Claim 17, delete "claim 1" and insert -- claim 9 --, therefor.

In column 10, line 5, in Claim 18, delete "claim 1" and insert -- claim 9 --, therefor.

Signed and Sealed this

Twenty-fourth Day of March, 2009

JOHN DOLL
*Acting Director of the United States Patent and Trademark Office*